US006413864B1

(12) United States Patent
Pyo

(10) Patent No.: US 6,413,864 B1
(45) Date of Patent: Jul. 2, 2002

(54) METHOD OF MANUFACTURING A COPPER METAL WIRING IN A SEMICONDUCTOR DEVICE

(75) Inventor: Sung Gyu Pyo, Kyungki-Do (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 09/880,815

(22) Filed: Jun. 15, 2001

(30) Foreign Application Priority Data

Jun. 15, 2000 (KR) ......................................... 2000-32920

(51) Int. Cl.$^7$ ................................................ H01L 21/44
(52) U.S. Cl. ........................ 438/687; 438/674; 438/680; 438/681
(58) Field of Search ............................... 438/687, 674, 438/680, 681

(56) References Cited

U.S. PATENT DOCUMENTS

2001/0019891 A1 * 9/2001 Koh et al. .................. 438/687

FOREIGN PATENT DOCUMENTS

JP            11-26394 A    *  1/1999  ........... H01L/21/28

OTHER PUBLICATIONS

Hwang, et al. "Surfactant–assisted metallorganic CVD of (111)–oriented copper films with excellent surface smoothness" Electrochemical and Solid–State Letters 3(3), Mar. 2000, pp. 138–140.*

Park et al. "Superfilling CVD of copper using a catalyst surfactant" Proceedings of the IEEE 2001 International Interconnect Technology Conference, Jun. 2001, pp. 12–14.*

Shim et al. "Bottom–up filling of submicrometer features in catalyst–enhanced chemical vapor deposition of copper" Journal of the Electrochemical Society 149(2), Feb. 2002, pp. G109–G113.*

* cited by examiner

Primary Examiner—Olik Chaudhuri
Assistant Examiner—Erik Kielin
(74) Attorney, Agent, or Firm—Finnegan, Henderson, Farabow, Garrett & Dunner, L.L.P.

(57) ABSTRACT

When forming a metal wiring by depositing copper by chemically enhanced chemical vapor deposition (CECVD) method, the present invention forms a diffusion barrier layer, performs chemical treatment using a chemical enhancer, performs a spin rinsing process using a wet cleaning solution and then leaves the chemical enhancer only at the bottom of a damascene pattern. Thus, the present invention allows selective partial fill of copper at the bottom portion of the hole and can prevent generation of voids or seams at the bottom portion of the hole.

19 Claims, 2 Drawing Sheets

METHOD OF MANUFACTURING A COPPER METAL WIRING IN A SEMICONDUCTOR DEVICE

BACKGROUND OF THE INVENTION

1. Field of the Invention

The invention relates generally to a method of manufacturing a copper metal wiring in a semiconductor device. More particularly, the present invention relates to a method of manufacturing a copper metal wiring in a semiconductor device capable of increasing the burial characteristic of copper (Cu) at the portion of holes having a small size and an increased aspect ratio, when forming a metal wiring by depositing Cu by chemically enhanced chemical vapor deposition (hereinafter called "CECVD") method.

2. Description of the Prior Art

The performance of next-generation semiconductor devices is rapidly increasing. Thus, it accordingly causes reduction in the size of the contact and steep inclination of the aspect ratio. Thus, when forming a metal wiring, good contact burial characteristic and step coverage are required.

A method of forming a metal wiring in a semiconductor device employs a method by which a thin titanium (Ti) film is deposited and then aluminum (Al) is deposited by a physical vapor deposition (hereinafter called "PVD") method or a chemical vapor deposition (hereinafter called "CVD") method, or a method by which thin tantalum (Ta) or tantalum nitride (TaN) film as a diffusion prevention film is formed by a PVD method and Cu is then deposited by an electroplating method. The former method, however, has a problem when applied to next-generation high-performance semiconductor devices since Al has a higher resistance than Cu. On the other hand, the latter method has a limited burial characteristic of Cu due to rapid reduction in the size of the contact and increased aspect ratio. Also, as the tantalum nitride film used as a diffusion prevention film against Cu has a high resistance compared to Al to which the diffusion prevention film is not applied, there is a problem that a very thin film is required. As such, applying a copper wiring using aluminum wiring and electro-plating to next-generation semiconductor devices causes several problems.

In order to solve these problems, a study has been made on a method in which CVD method is applied in deposition of a copper wiring. This method, however, has a limitation in a bulk filling due to low deposition speed.

Recently, a study has been made on a method of depositing a thin copper film using a metal organic chemical vapor deposition (hereinafter called "MOCVD") method using a chemical enhancer such as iodine (I) catalyst. The MOCVD method using this a chemical enhancer is referred to as the chemically enhanced chemical vapor deposition (hereinafter called "CECVD") method. In the CECVD method, however, as the chemical enhancer is distributed on the entire damascene structure, there is a problem in that voids or seams are generated at the bottom of the hole having a smaller size and an increased aspect ratio during a subsequent copper deposition process.

SUMMARY OF THE INVENTION

The present invention to provide a method of manufacturing a copper metal wiring in a semiconductor device by which a diffusion prevention film is formed, a chemical enhancer treatment is performed and a chemical enhancer layer is then left over at the bottom of a hole, so that the growth rate of copper at the bottom of the hole can be increased when depositing copper using a subsequent copper precursor, thus preventing generation of voids or seams.

A method of manufacturing a copper metal wiring in a semiconductor device according to the present invention comprises forming an interlayer insulating film on a semiconductor substrate in which an underlying structure is formed; forming a damascene pattern by patterning a given region of the interlayer insulating film; performing a cleaning process, and then forming a diffusion barrier layer on the entire structure including the damascene pattern; forming a chemical enhancer layer on the diffusion barrier layer by performing a chemical enhancer treatment; leaving the chemical enhancer layer only at a contact hole of the damascene pattern by performing a spin rinsing process and a warm annealing process; sequentially forming first and second copper layers on the entire structure in which the chemical enhancer layer remains; and forming a copper metal wiring within the damascene pattern.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1A:
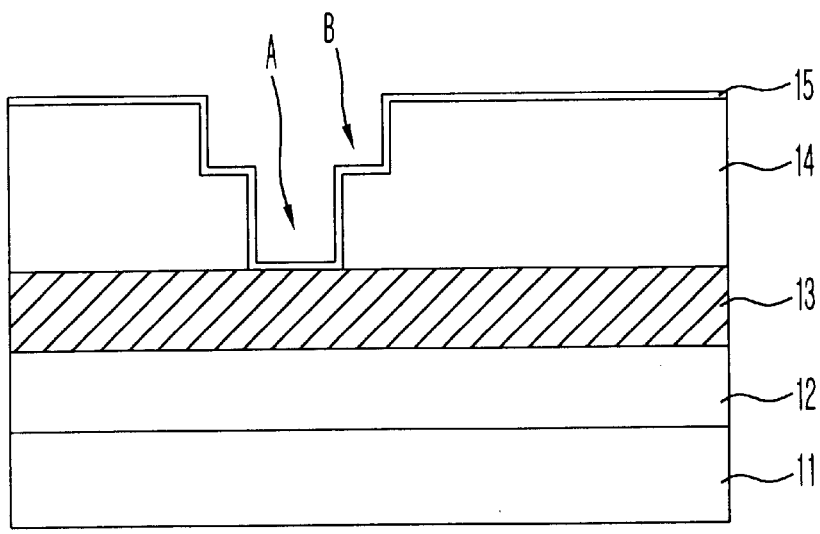
FIGS. 1A to 1F are cross-sectional views for sequentially illustrating a method of manufacturing a copper metal wiring in a semiconductor device according to one embodiment of the present invention.

Referring now to FIG. 1A, a first interlayer insulating film 12 and an underlying metal layer 13 are formed on a semiconductor substrate 11 in which an underlying structure is formed. A second interlayer insulating film 14 is then formed on the entire structure. Next, a given region of the second interlayer insulating film 14 is patterned by a single damascene or a dual damascene process, thus forming a damascene pattern consisting of a contact hole A and a trench B. Thereafter, a cleaning process is performed. Then, a diffusion barrier layer 15 is formed on the entire structure in which the damascene pattern is formed.

Currently, the interlayer insulating film 12 is formed of an oxide material or an insulating material having a low dielectric constant. The cleaning process after formation of the damascene pattern employs RF plasma in cases where the underlying metal layer 13 is made of W or Al. If the underlying metal layer 13 is made of Cu, the cleaning process employs a reactive cleaning method.

The diffusion barrier layer 15 is formed by depositing titanium nitride (TiN) by means of one of an ionized PVD method, a CVD method and a MOCVD method, depositing tantalum or tantalum nitride (TaN) by means of an ionized PVD method or CVD method, depositing tungsten nitride (WN) by means of a CVD method, or depositing any one of titanium aluminum nitride (TiAlN), titanium silicon nitride (TiSiN), tantalum silicon nitride (TaSiN) by means of a PVD method or CVD method.

Figure 1B:
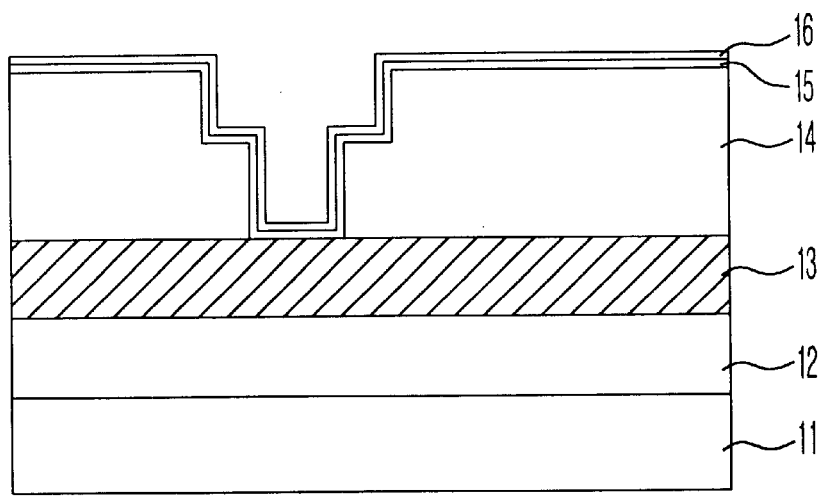

Referring now to FIG. 1B, a seed layer 16 is formed on the entire structure on which the diffusion barrier layer 15 is formed or a plasma treatment is performed so that the chemical enhancer can be uniformly adhered. At this time, the seed layer 16 is formed in thickness of 5 to 500 Å using one of titanium (Ti), aluminum (Al) and copper (Cu).

Figure 1C:
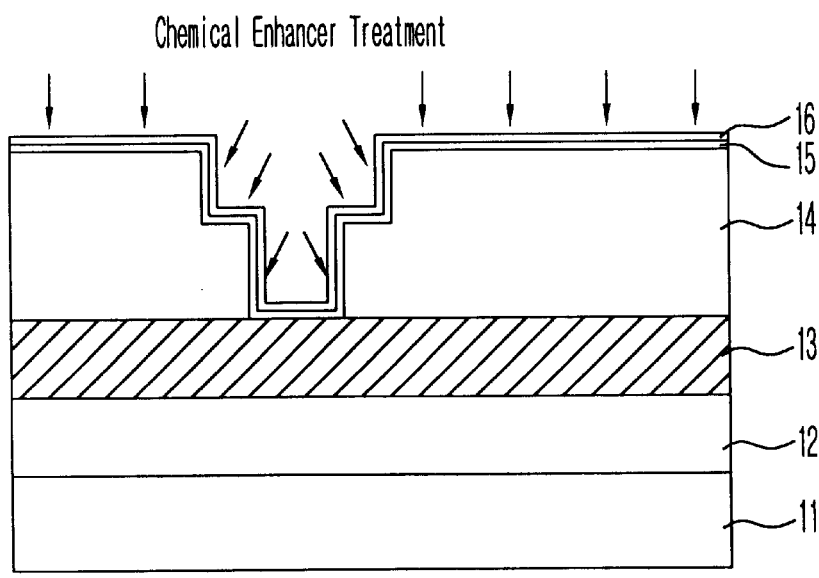

Referring to FIG. 1C, a chemical enhancer treatment is performed for the entire structure on which the seed layer 16 is formed.

A chemical enhancer used in the present invention includes one of a iodine (I)-containing liquid compound, H(hfac)1/2H$_2$O, H(hfac) and TMVS, one of pure iodine, iodine (I)-containing gas and water vapor or one of liquid state and gaseous state of group-7 elements, such as F, Cl, Br, I, At, and the gaseous state or the liquid state of their mixture. The treatment time is 1 second to 10 minutes and the treatment temperature is −20 to 300° C.

Figure 1D:
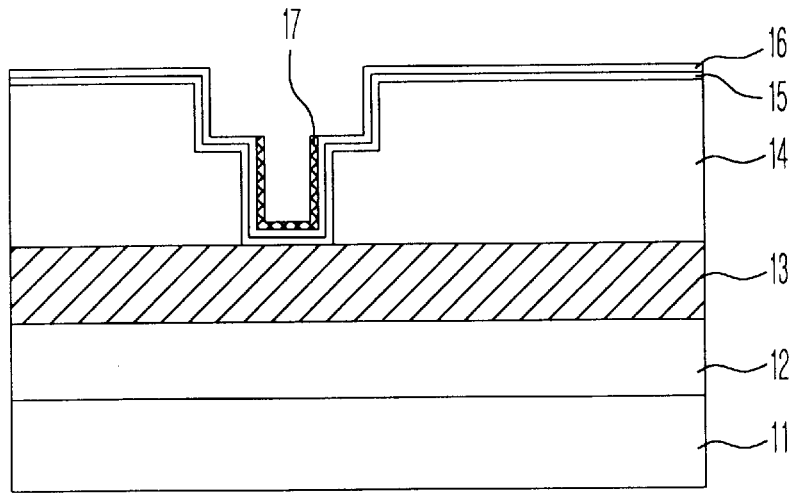

Referring now to FIG. 1D, a spin rinsing is performed for the entire structure on which a chemical enhancer layer 17 is formed by the chemical enhancer treatment, using a wet cleaning solution. In order to remove any remaining cleaning solution, a warm annealing processing is performed. Thus, the chemical enhancer layer 17 remains only at the contact hole A.

The spin rinsing processing allows the copper layer to have a high growth rate at its bottom portion. The spin rinsing process, using a wet cleaning solution, is performed at a temperature ranging from −20 to 50° C. for a time ranging from 1 second to 5 minutes, using solutions for easily removing the chemical enhancer such as DI, DI+H$_2$SO$_4$, BOE or DI+HF. The rotational speed of the wafer, when the spin rinsing process, ranges from 1 to 3000 rp.

Meanwhile, the warm annealing process, performed after the spin rinsing process, is performed at a temperature ranging between room temperature and 200° C. Also, in order to remove the cleaning solution, the wafer is rotated at a speed range of 1 to 2000 rpm.

Figure 1E:
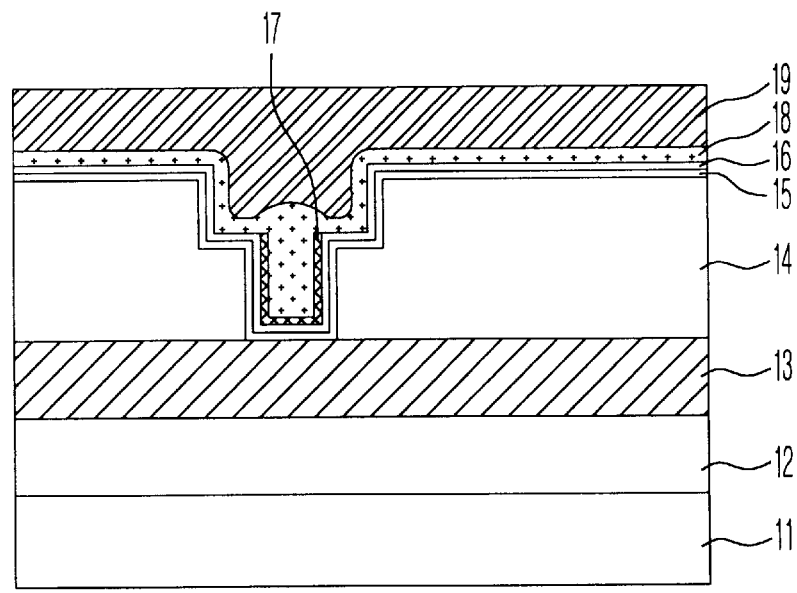

Referring now to FIG. 1E, a first copper layer 18 is formed on the entire structure in which the chemical enhancer layer 17 remains only within the contact hole A. At this time, since deposition of copper is accelerated at the portion of the contact hole A in which the chemical enhancer layer 17 remains, a selective partial fill can be accomplished.

The first copper layer 18 is formed by depositing copper (Cu) by means of MOCVD method using all kinds of deposition equipment in which a liquid delivery system (LDS) is mounted such as direct liquid injection (DLI), control evaporation mixer (CEM), orifice, spray, by use of all kinds of Cu precursors using hfac, such as (hfac)Cu (VTMOS) series, (hfac)Cu(DMB) series, or (hfac)Cu (TMVS) series. The flow rate of the precursor ranges from 0.1 to 5.0 sccm.

Meanwhile, a carrier gas uses He, H$_2$ and Ar ranging between 100 and 700 sccm and the pressure within the reaction chamber is in a range of 0.5 to 5 Torr. Also, it is required that the temperature of the reaction chamber is maintained at the same temperature as the deposition equipment and the temperature of the showerhead is kept constant. The deposition temperature is in a range of 50 to 300° C. and the distance between the showerhead and the susceptor plate in the reaction chamber must be kept in the range of 5 to 50 mm.

Thereafter, a second copper layer 19 is formed on the first copper layer 18 by an electro-plating method, thus forming a damascene pattern.

After forming first and second copper layers 18 and 19 by this method, an annealing process is performed under a hydrogen reduction atmosphere at a temperature ranging between room temperature to 450° C. for between 1 minute and 3 hours, so that grain morphology is changed. The hydrogen reduction atmosphere may use hydrogen (H$_2$) only or a hydrogen mixture gas where Ar of 0.1 to 95% or N$_2$ of 0.1 to 95% is mixed with H$_2$.

Figure 1F:
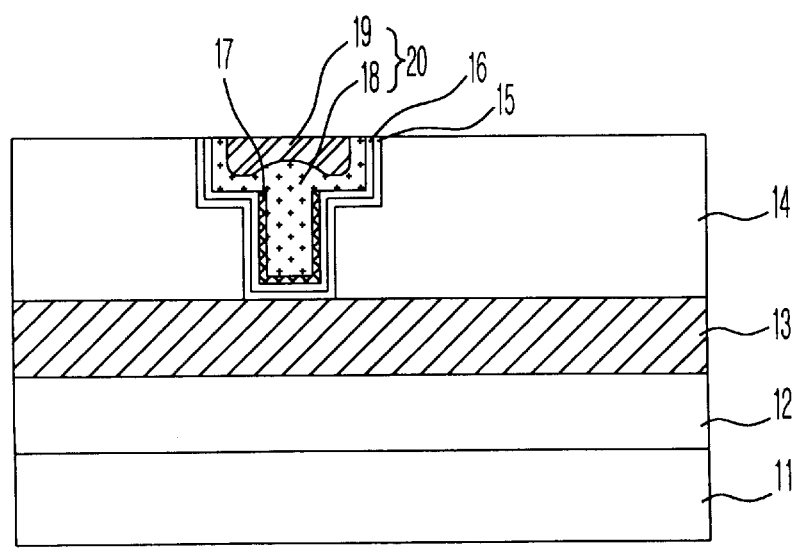

Referring now to FIG. 1F, after the annealing process is performed, a chemical mechanical polishing process is performed. Thus, an upper portion of the second interlayer insulating film 14 is exposed and the first and second copper layers 18 and 19 are filled only within the damascene pattern, thus forming a copper metal wiring 20. Finally, a cleaning process is performed.

As mentioned above, according to the present invention, a chemical enhancer remains only at the bottom of a hole having a small size and a large aspect ratio, by performing a spin ringing process using a wet cleaning solution after a chemical enhancer treatment is performed, when a metal wiring is formed by depositing copper by CECVD method. Thus, the present invention can prevent generation of voids or seams at the bottom of the hole because selective partial fill of copper is made possible at the bottom of the hole. Therefore, the present invention can improve a filling characteristic of copper into an ultra-fine pattern and can also improve the process cost.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a copper metal wiring in a semiconductor device, comprising the steps of:

forming an interlayer insulating film on a semiconductor substrate in which an underlying structure is formed;

forming a damascene pattern having a contact hole and a trench by patterning a given region of said interlayer insulating film;

forming a diffusion barrier layer on the structure including said damascene pattern;

forming a seed layer on said diffusion barrier layer;

forming a chemical enhancer layer on said seed layer by performing a chemical enhancer treatment;

performing a spin rinsing process and a warm annealing process whereby said chemical enhancer layer remains only at said contact hole of said damascene pattern;

forming a first copper layer on the structure in which said chemical enhancer layer remains;

forming a second copper layer on said first copper layer;

annealing said first and second layers; and forming a copper metal wiring within said damascene pattern.

2. The method of manufacturing a copper metal wiring in a semiconductor device according to claim 1, wherein said diffusion barrier layer is formed of a material selected from a group consisting of titanium nitride (TiN), tantalum (Ta), tantalum nitride (TaN), tungsten nitride (WN), titanium aluminum nitride (TiAlN), titanium silicon nitride (TiSiN) and tantalum silicon nitride (TaSiN).

3. The method of manufacturing a copper metal wiring in a semiconductor device according to claim 1, wherein said seed layer is formed in thickness of between 5 and 500 Å using one material selected from a group consisting of titanium (Ti), aluminum (Al), and copper (Cu).

4. The method of manufacturing a copper metal wiring in a semiconductor device according to claim 1, wherein said chemical enhancer treatment is performing using one substance selected from a group consisting of iodine (I)-containing liquid compound, H(hfac)1/2H$_2$O, H(fac) and TMVS, one of pure iodine, iodine (I)-containing gas and water vapor or one of liquid state and gaseous state of group-7 elements selected F, Cl, Br, I, At, and the gaseous state or the liquid state of their mixture.

5. The method of manufacturing a copper metal wiring in a semiconductor device according to claim 1, wherein the chemical enhancer treatment is performed for between 1 second and 10 minutes.

6. The method of manufacturing a copper metal wiring in a semiconductor device according to claim 1, wherein the chemical enhancer treatment is performed at a temperature in the range of between −20 and 300° C.

7. The method of manufacturing a copper metal wiring in a semiconductor device according to claim 1, wherein said spin rinsing process is performed using solutions selected from a group consisting of DI, DI+H$_2$SO$_4$, BOE, and DI+HF.

8. The method of manufacturing a copper metal wiring in a semiconductor device according to claim 1, wherein said spin rinsing process is performed at a temperature in a range of between −20 and 50° C. for between 1 second and 5 minutes.

9. The method of manufacturing a copper metal wiring in a semiconductor device according to claim 1, wherein a rotational speed of the substrate during the spin rinsing process is in the range of between 1 and 3000 rpm.

10. The method of manufacturing a copper metal wiring in a semiconductor device according to claim 1, wherein said warm annealing process is performed at the temperature in the range of bet ween room temperature and 200° C.

11. The method of manufacturing a copper metal wiring in a semiconductor device according to claim 1, wherein during said warm annealing process, the substrate is rotated at a rate in the range of between 1 and 2000 rpm.

12. The method of manufacturing a copper metal wiring in a semiconductor device according to claim 1, wherein said first copper layer is formed of copper precursors selected from a group consisting of (hfac)CuVTMOS series, (hfac)CuDMB series and (hfac)CuTMVS series.

13. The method of manufacturing a copper metal wiring in a semiconductor device according to claim 1, wherein said first copper layer is formed by depositing copper by means of metal organic chemical vapor deposition (MOCVD) method.

14. The method of manufacturing a copper metal wiring in a semiconductor device according to claim 1, wherein said first copper layer is formed by flowing a copper precursor at a flow rate ranging from between 0.1 to 5.0 sccm.

15. The method of manufacturing a copper metal wiring in a semiconductor device according to claim 1, wherein said first copper layer is formed by flowing a carrier gas such as He, H$_2$, or Ar at a flow rate ranging from between 100 and 700 sccm.

16. The method of manufacturing a copper metal wiring in a semiconductor device according to claim 1, wherein said first copper layer is formed at a temperature ranging between 50 and 300° C.

17. The method of manufacturing a copper metal wiring in a semiconductor device according to claim 1, wherein said second copper layer is formed by an electroplating method.

18. The method of manufacturing a copper metal wiring in a semiconductor device according to claim 1, wherein an annealing process is performed under hydrogen reduction atmosphere at a temperature ranging between room temperature and 450° C. for between 1 minutes and 3 hours.

19. The method of manufacturing a copper metal wiring in a semiconductor device according to claim 18, wherein said hydrogen reduction atmosphere uses hydrogen (H$_2$) only or a hydrogen mixture gas where Ar of 0.1 to 95% or N$_2$ of 0.1 to 95% is mixed with hydrogen (H$_2$).

* * * * *

UNITED STATES PATENT AND TRADEMARK OFFICE
CERTIFICATE OF CORRECTION

PATENT NO. : 6,413,864 B1
DATED : July 2, 2002
INVENTOR(S) : Sung Gyu Pyo

It is certified that error appears in the above-identified patent and that said Letters Patent is hereby corrected as shown below:

<u>Column 5,</u>
Line 10, after "selected" insert -- from --.
Line 37, "bet ween" should read -- between --.

<u>Column 6,</u>
Line 34, "minutes" should read -- minute --.

Signed and Sealed this

Eleventh Day of March, 2003

JAMES E. ROGAN
*Director of the United States Patent and Trademark Office*